United States Patent
Lu et al.

(10) Patent No.: US 10,412,867 B2
(45) Date of Patent: Sep. 10, 2019

(54) ELECTROMAGNETIC SHIELDING ASSEMBLY, ELECTROMAGNETIC INTERFERENCE AND LIGHTNING PROTECTION MODULE AND POWER SUPPLY

(71) Applicant: 3Y POWER TECHNOLOGY (TAIWAN), INC., Taoyuan (TW)

(72) Inventors: Shao-Feng Lu, Taoyuan (TW); Chuan-Kai Wang, Taoyuan (TW); Yi-Chen Kuan, Taoyuan (TW); Chung-Yu Lan, Taoyuan (TW); Jen-Ming Hsu, Taoyuan (TW); Chao-Wen Fu, Taoyuan (TW)

(73) Assignee: 3Y POWER TECHNOLOGY (TAIWAN), INC., Taoyuan (TW)

( * ) Notice: Subject to any disclaimer, the term of this patent is extended or adjusted under 35 U.S.C. 154(b) by 0 days.

(21) Appl. No.: 16/240,786

(22) Filed: Jan. 6, 2019

(65) Prior Publication Data
US 2019/0246529 A1    Aug. 8, 2019

(30) Foreign Application Priority Data
Feb. 6, 2018    (CN) .......................... 2018 1 0119438

(51) Int. Cl.
*H05K 9/00* (2006.01)
*H02M 1/44* (2007.01)

(52) U.S. Cl.
CPC ............ *H05K 9/0094* (2013.01); *H02M 1/44* (2013.01); *H05K 9/0007* (2013.01)

(58) Field of Classification Search
CPC .. H05K 9/0094; H05K 9/0007; H05K 7/1492; H05K 5/0221; H05K 5/0247; H05K 5/0013; H05K 5/0204; H05K 5/0217; H05K 5/023; H02M 1/44; G06F 1/188; G06F 1/1616; G06F 1/1656; G06F 1/1688
See application file for complete search history.

(56) References Cited

U.S. PATENT DOCUMENTS 6,059,586 A * 5/2000 Watanabe ............ H05K 5/0269
                                                              439/159
7,200,004 B2 * 4/2007 Chen ...................... G06F 1/188
                                                              361/679.39

(Continued)

*Primary Examiner* — Abhishek M Rathod
(74) *Attorney, Agent, or Firm* — Winston Hsu

(57) ABSTRACT

The present invention discloses an electromagnetic shielding assembly including an electromagnetic interference shielding component including a plate body and a bending portion. An included angle is formed between the plate body and the bending portion, and the plate body and the bending portion cover an input socket of a power supply. The electromagnetic interference shielding component includes at least one grounding pin disposed on the plate body or/and the bending portion and configured to ground with and screw to a housing of the power supply, and a welding pin disposed on a side of the bending portion away from the plate body and electrically connected to an auxiliary circuit board. The electromagnetic interference shielding component provides functions of EMI shielding, lightning (current) discharging and fixture, which can simplify the structure, increase the discharging speed and time, and reduce the amount of disturbance of the large current instantaneous to the ground.

13 Claims, 8 Drawing Sheets

(56) References Cited

U.S. PATENT DOCUMENTS

| | | | | |
|---|---|---|---|---|
| 7,217,146 B2* | 5/2007 | Meister | ............... | H01R 13/443 |
| | | | | 439/148 |
| 8,553,398 B2* | 10/2013 | Tatsukami | ............ | G06F 1/1616 |
| | | | | 361/679.02 |
| 9,904,329 B2* | 2/2018 | Sisler | ...................... | G06F 1/183 |
| 2009/0258536 A1* | 10/2009 | Lee | ................... | H01R 12/7047 |
| | | | | 439/567 |
| 2010/0254105 A1* | 10/2010 | Lu | ....................... | H05K 7/1417 |
| | | | | 361/759 |
| 2012/0293975 A1* | 11/2012 | Liang | ..................... | G06F 1/188 |
| | | | | 361/807 |
| 2015/0015130 A1* | 1/2015 | Lu | ....................... | H05K 5/0013 |
| | | | | 312/265.5 |
| 2017/0017276 A1* | 1/2017 | Ganta | .................... | G06F 1/188 |
| 2018/0103563 A1* | 4/2018 | Lu | ....................... | H05K 5/0217 |
| 2019/0132967 A1* | 5/2019 | Lu | ....................... | H05K 5/0204 |

* cited by examiner

ELECTROMAGNETIC SHIELDING ASSEMBLY, ELECTROMAGNETIC INTERFERENCE AND LIGHTNING PROTECTION MODULE AND POWER SUPPLY

BACKGROUND OF THE INVENTION

1. Field of the Invention

The present invention relates to an electromagnetic shielding assembly, an electromagnetic interference and lightning protection module and a power supply, and more particularly, to an electromagnetic shielding assembly, an electromagnetic interference and lightning protection module and a power supply with enhanced heat dissipating efficiency, high lightning discharge speed, simplified structure, easy assembly and low manufacturing cost.

2. Description of the Prior Art

A power supply is a device for converting AC power into stable DC power required for various electronic devices. In order to suppress electromagnetic interference, an Electromagnetic Interference (EMI) filter circuit is installed on a main circuit board of the power supply. However, with the miniaturization and narrowing requirement of the power supply, the components of the electromagnetic interference filter circuit cannot be set on the main circuit board, so that there is a design in which the electromagnetic interference filter circuit is disposed on a small board additionally, and the small board is perpendicular to the main circuit board and disposed between an input socket and a fan or a remaining space between the fan and a housing, which affects internal airflow of the power supply and causes poor heat dissipation.

In addition, a lightning protection circuit is also installed on the main circuit board for suppressing the instantaneous high voltage. The discharge speed for the high voltage test depends on a grounding distance, a wire diameter or a grounding area, and the existing setting method has problems of the poor discharge speed, complicated structure, and increase of cost.

Therefore, it is necessary to provide an electromagnetic shielding assembly, an electromagnetic interference and lightning protection module and a power supply with enhanced heat dissipating efficiency, high lightning discharge speed, simplified structure and low manufacturing cost, for solving the above problems.

SUMMARY OF THE INVENTION

Therefore, an objective of the present invention is to provide an electromagnetic shielding assembly, an electromagnetic interference and lightning protection module and a power supply with enhanced heat dissipating efficiency, high lightning discharge speed, simplified structure, easy assembly and low manufacturing cost.

In order to achieve the aforementioned objective, the present invention discloses an electromagnetic shielding assembly adapted for a power supply and including an electromagnetic interference shielding component. The electromagnetic interference shielding component includes a plate body and a bending portion. An included angle is formed between the plate body and the bending portion, and the plate body and the bending portion cooperatively cover an input socket of the power supply. The electromagnetic interference shielding component further includes at least one grounding pin disposed on at least one of the plate body and the bending portion and configured to ground with and screw to a housing of the power supply, and a welding pin disposed on a side of the bending portion away from the plate body and configured to electrically connect to an auxiliary circuit board.

Preferably, a first grounding pin is disposed on the bending portion, a second grounding pin is disposed on the plate body and extends in a direction opposite to the first grounding pin, and the first grounding pin and the second grounding pin are grounded with and screwed to the housing of the power supply.

Preferably, a folding portion is disposed on the plate body and extends in a direction parallel with and opposite to the bending portion, and the second grounding terminal is disposed on the folding portion.

Preferably, an inclined surface is formed on the side of the bending portion away from the plate body and inclined from a lateral side of the bending portion and towards the welding pin.

Preferably, the electromagnetic interference shielding component is substantially formed in a U shape.

Preferably, the electromagnetic interference shielding component is an integrally formed structure.

Preferably, the electromagnetic shielding assembly further includes an annular iron core electrically connected to the at least one grounding pin in a series connection and for filtering.

In contrast to the prior art, the plate body and the bending portion of the electromagnetic interference shielding component cover the input socket so as to provide EMI shielding function. The welding pin of the electromagnetic interference shielding component is electrically connected to the auxiliary circuit board, so that the electromagnetic interference shielding component can be used as a current discharging path when the circuit is abnormal and a leakage path of a lightning tube when the lightning strikes. The current can be transmitted to the ground through the welding pin, the first grounding pin and the second grounding pin. The electromagnetic interference shielding component is disposed adjacent to the input socket and has a high conductivity better than a copper core wire, and the conductive sectional area of the electromagnetic interference shielding component is larger than a sectional area of the copper core wire, thereby reducing the impedance on the ground loop, increasing the discharging speed and time, and reducing the amount of disturbance of the large current instantaneous to the ground. Additionally, the first grounding pin and the second grounding pin of the electromagnetic interference shielding component can not only provide grounding function but also fix to the housing, so that there is no need to utilize any additional fixture for fixing the electromagnetic interference shielding component, which facilitates an assembly process and simplifies the structure.

In order to achieve the aforementioned objective, the present invention further discloses an electromagnetic interference and lightning protection module adapted for a power supply. The electromagnetic interference and lightning protection module includes an electromagnetic interference shielding component and a lightning protection circuit. The electromagnetic interference shielding component includes a plate body and a bending portion. An included angle is formed between the plate body and the bending portion, and the plate body and the bending portion cooperatively cover an input socket of the power supply. The electromagnetic interference shielding component further includes at least one grounding pin disposed on at least one of the plate body and the bending portion and configured to ground with and screw to a housing of the power supply, and a welding pin disposed on a side of the bending portion away from the plate body and configured to electrically connect to an end of an auxiliary circuit board. The lightning protection circuit includes at least one surge absorber electrically connected to another end of the auxiliary circuit board and located in a position corresponding to an axis of a fan of the power supply, and the electromagnetic interference shielding component and the at least one surge absorber are disposed at a same side of the auxiliary circuit board.

Preferably, a first grounding pin is disposed on the bending portion, a second grounding pin is disposed on the plate body and extends in a direction opposite to the first grounding pin, and the first grounding pin and the second grounding pin are grounded with and screwed to the housing of the power supply.

Preferably, the lightning protection circuit further includes at least one lightning tube electrically connected to the auxiliary circuit board and located on a lateral side of the surge absorber.

Preferably, the at least one surge absorber is a cylinder structure, and a center of a bottom surface of the at least one surge absorber corresponds to the axis of the fan of the power supply.

Preferably, the lightning protection circuit further includes at least one insulating component for covering the at least one surge absorber.

Preferably, the electromagnetic interference and lightning protection module further includes an electromagnetic interference filter circuit disposed on the auxiliary circuit board.

In order to achieve the aforementioned objective, the present invention further discloses a power supply including a housing, a main circuit board, a fan, an input socket and an electromagnetic interference and lightning protection module. The housing includes an upper casing and a lower casing combined with each other. The main circuit board is disposed on the lower casing. The fan is disposed on the lower casing and adjacent to the main circuit board. The input socket is disposed on an end of the lower casing and spaced from the fan. The auxiliary circuit board is disposed between the housing and the input socket and perpendicular to the main circuit board, and the at least one surge absorber is disposed between the input socket and the fan. The at least one surge absorber is located in a position corresponding to an axis of the fan.

In contrast to the prior art, the electromagnetic interference and lightning protection module of the present invention includes the electromagnetic interference shielding component with the functions of EMI shielding, lightning (current) discharging and fixture, the lightning protection circuit and the electromagnetic interference filter circuit, and therefore the electromagnetic interference and lightning protection module has EMI filtering, lightning protection, socket adapting and other functions, so that the structure is simplified, the EMI filtering parameters and parts can be changed, the lightning protection level can be adjusted, and the input socket of different types can be matched. Furthermore, the surge absorber and the axis of the fan are disposed correspondingly, and therefore, according to the fluid mechanics, it can directly reduce the internal drag coefficient of the power supply, and a spiral effect of fan blades of the fan can be utilized to guide wind flow to flow along a path with the low wind resistance around the surge absorber, so that the spiral wind can be directly discharged outside the power supply, so as to eliminate the thermal vortex effect and not to affect and reduce the wind flow (CFM). Besides, the electromagnetic interference filter circuit, the electromagnetic shielding component and the lightning protection circuit are all disposed on the auxiliary circuit board, which can effectively save a wiring area of the main circuit board, and the utilization of the electromagnetic shielding component can reduce the composite material (e.g. wire) to be used, so as to reduce the manufacture cost.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
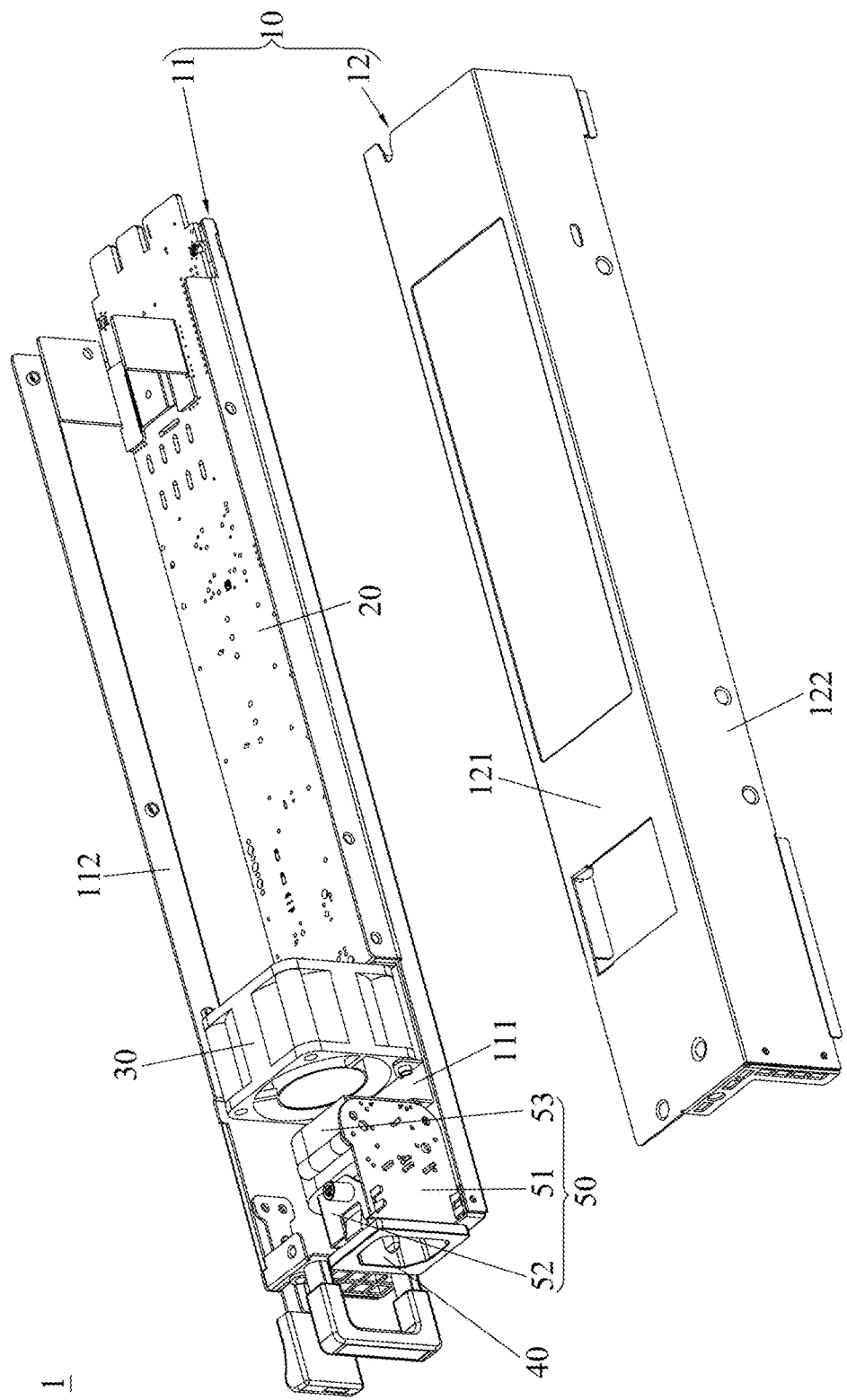
FIG. 1 is an exploded diagram of a power supply of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
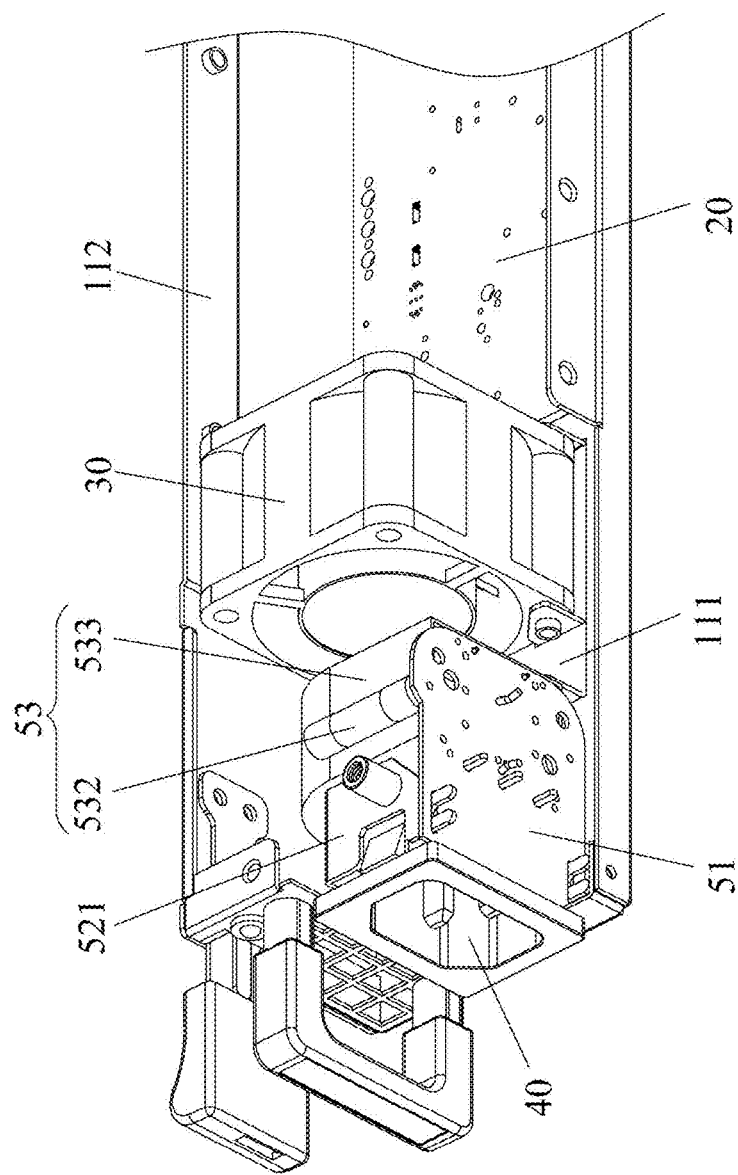
FIG. 2 is a partial enlarged diagram of the power supply as shown in FIG. 1 without illustrating a housing of the present invention.
Figure 3:
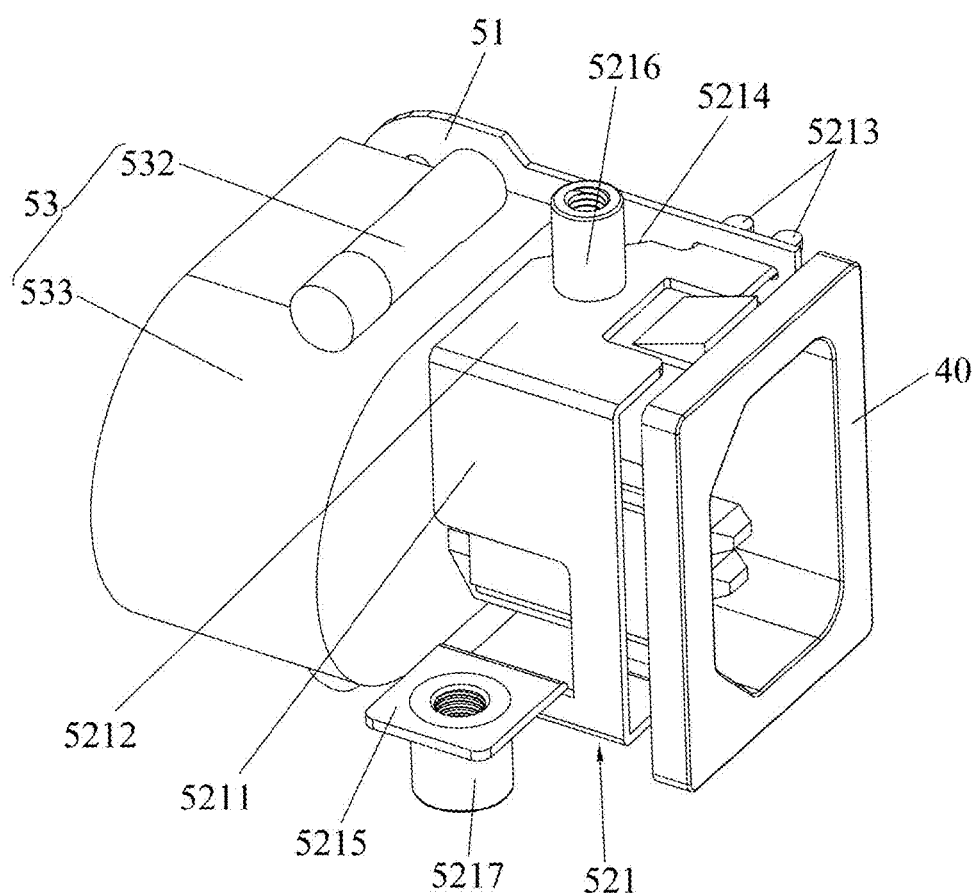
FIG. 3 is a schematic diagram of an electromagnetic interference and lightning protection module cooperating with an input socket of the present invention.
Figure 4:
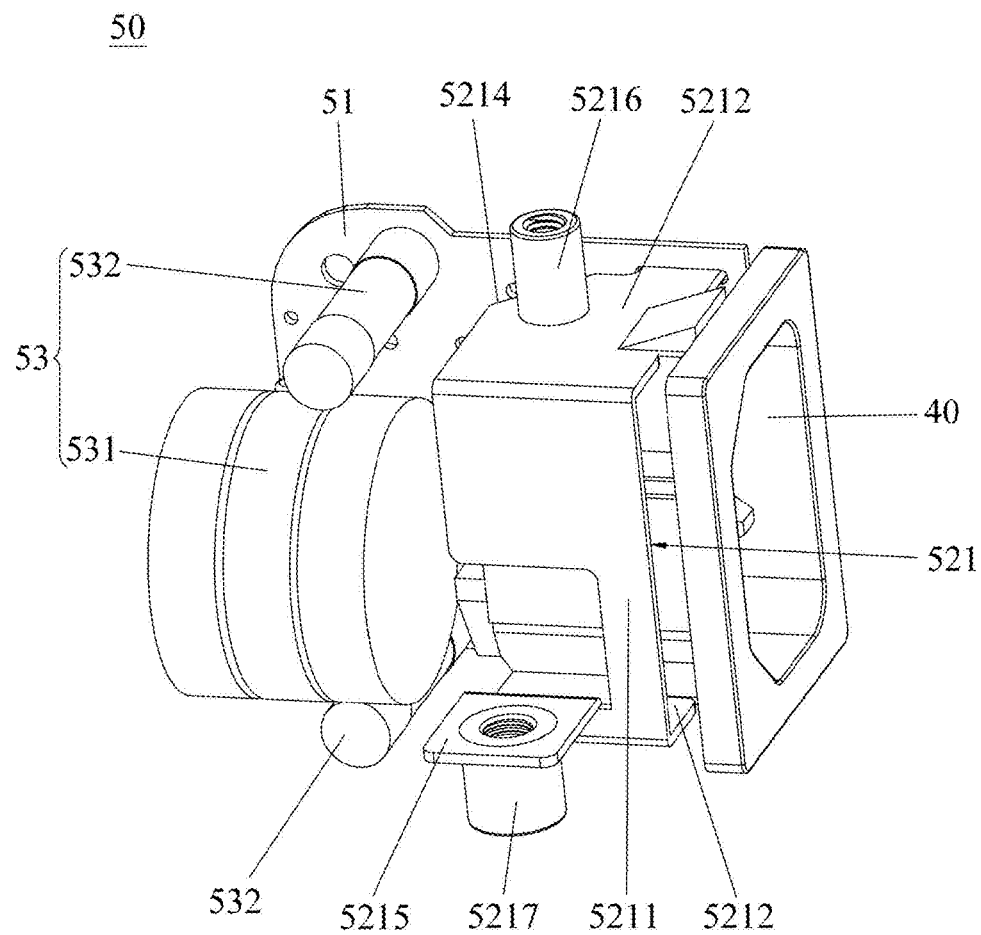
FIG. 4 is a schematic diagram of the electromagnetic interference and lightning protection module cooperating with the input socket without illustrating an insulating component and at another view of the present invention.
Figure 5:
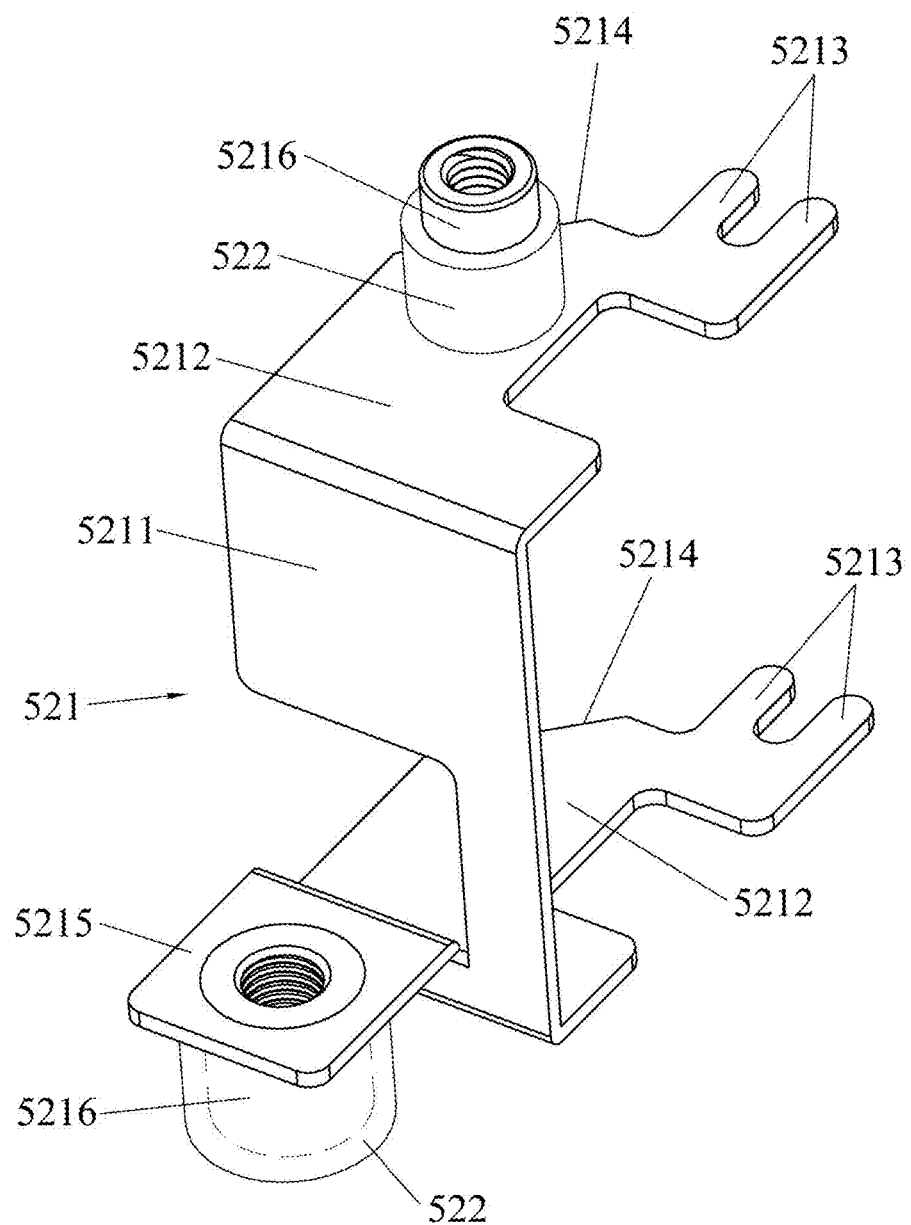
FIG. 5 is a schematic diagram of an electromagnetic shielding assembly as shown in FIG. 3 of the present invention.
Figure 6:
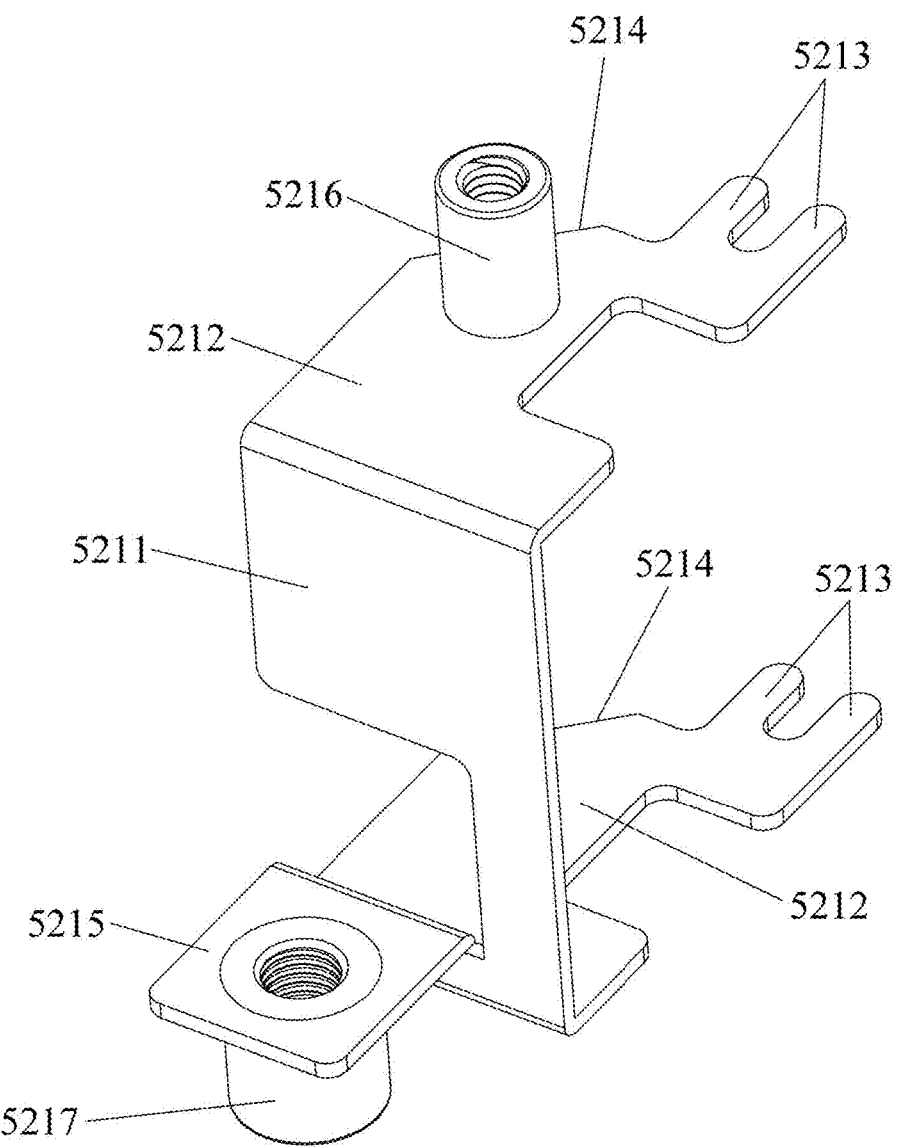
FIG. 6 is a schematic diagram of an electromagnetic interference shielding component as shown in FIG. 5 of the present invention.
Figure 7:
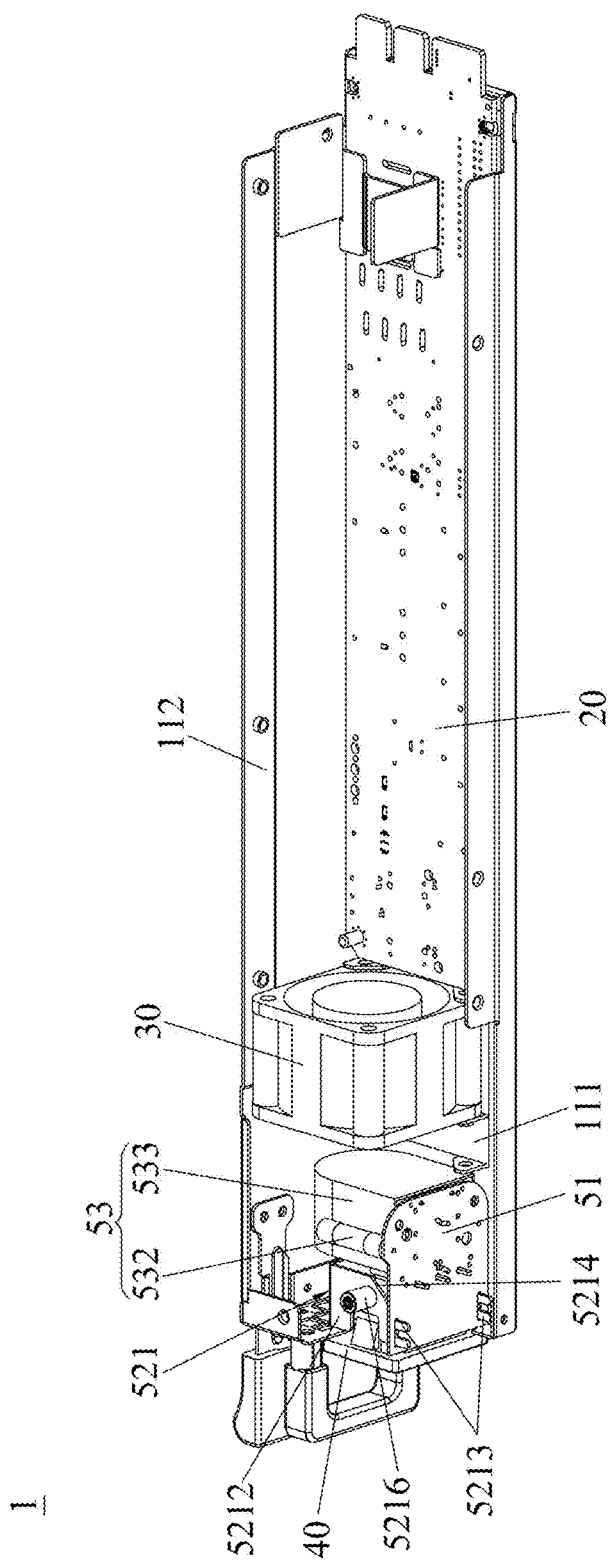
FIG. 7 is a schematic diagram of the power supply as shown in FIG. 1 without illustrating an upper casing and at another view of the present invention.
Figure 8:
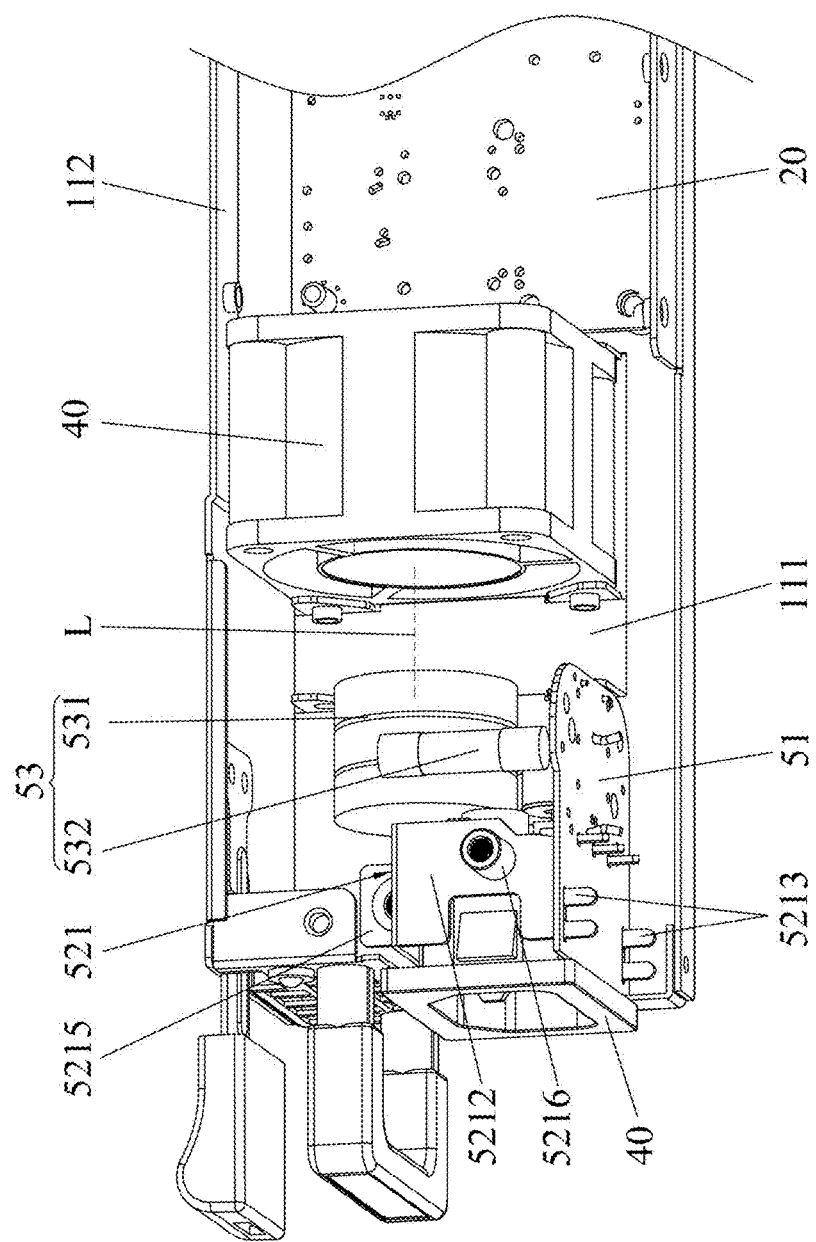
FIG. 8 is a partial enlarged diagram of the power supply as shown in FIG. 7 without illustrating the insulating component of the present invention.

Please refer to FIG. 1 to FIG. 8. FIG. 1 is an exploded diagram of a power supply 1 of the present invention. FIG. 2 is a partial enlarged diagram of the power supply 1 as shown in FIG. 1 without illustrating a housing 10 of the present invention. FIG. 3 is a schematic diagram of an electromagnetic interference and lightning protection module 50 cooperating with an input socket 40 of the present invention. FIG. 4 is a schematic diagram of the electromagnetic interference and lightning protection module 50 cooperating with the input socket 40 without illustrating an insulating component 533 and at another view of the present invention. FIG. 5 is a schematic diagram of an electromagnetic shielding assembly 52 as shown in FIG. 3 of the present invention. FIG. 6 is a schematic diagram of an electromagnetic interference shielding component 521 as shown in FIG. 5 of the present invention. FIG. 7 is a schematic diagram of the power supply 1 as shown in FIG. 1 without illustrating an upper casing 12 and at another view of the present invention. FIG. 8 is a partial enlarged diagram of the power supply 1 as shown in FIG. 7 without illustrating the insulating component 533 of the present invention. The power supply 1 includes, but is not limited to, the housing 10, a main circuit board 20, a fan 30, the input socket 40 and the electromagnetic interference and lightning protection module 50. The main circuit board 20, the fan 30 and the input socket 40 are installed inside the housing 10, the fan 30 is disposed adjacent to the main circuit board 20, the input socket 40 is disposed on an end of the housing 10 and spaced from the fan 30, and a gap is formed between the input socket 40 and the housing 10. The electromagnetic interference and lightning protection module 50 is installed inside the gap between the input socket 40 and the housing 10 and spaced from the fan 30. Understandably, the location of the electromagnetic interference and lightning protection module 50 is not limited to this embodiment and depends on actual structural design of the power supply 1.

Please refer to FIG. 1. The housing 10 includes the upper casing 11 and a lower casing 12 combined with each other. The lower casing 11 includes a bottom plate 111 and a first lateral plate 112 protruded from a lateral side of the bottom plate 111. The upper casing 12 includes a top plate 121 and a second lateral plate 122 protruded from a lateral side of the top plate 121. When the upper casing 12 and the lower casing 11 are combined with each other, the top plate 121 and the bottom plate 111 are parallel with each other, the first lateral plate 112 and the second lateral plate 122 are parallel with each other, the top plate 121 and the first lateral plate 112 are connected to each other, and the bottom plate 111 and the second lateral plate 122 are connected to each other. Understandably, the configuration of the upper casing 11 and the lower casing 12 is not limited to this embodiment, and any structure capable of forming the housing 10 is within the scope of the present invention. The main circuit board 20, the fan 30 and the input socket 40 are sequentially disposed on the bottom plate 111, and the main circuit board 20 is arranged along a longitudinal direction of the bottom plate 111. A plurality of electronic components can be installed on the main circuit board 20.

Please refer to FIG. 2 to FIG. 6. The electromagnetic interference and lightning protection module 50 includes an auxiliary circuit board 51, the electromagnetic shielding assembly 52, a lightning protection circuit 53 and an electromagnetic interference filter circuit (not shown in figures) disposed on the auxiliary circuit board 51. The electromagnetic shielding assembly 52 and the lightning protection circuit 53 are electrically connected to the auxiliary circuit board 51 and disposed on two ends and at a same side of the auxiliary circuit board 51, as shown in FIG. 3 and FIG. 4.

Please refer to FIG. 3, FIG. 4 and FIG. 6. The electromagnetic shielding assembly 52 includes an electromagnetic interference shielding component 521 having a plate body 5211 and at least one bending portion 5212. An included angle is formed between the plate body 5211 and the bending portion 5212, and the plate body 5211 and the bending portion 5212 cooperatively cover the input socket 40. The electromagnetic interference shielding component 521 further includes a welding pin 5213 disposed on a side of the bending portion 5212 away from the plate body 5211 and configured to electrically connect to an end of the auxiliary circuit board 51. Specifically, two bending portions 5212 are protruded from two ends of the plate body 5211 and arranged symmetrically, so as to form the U-shaped electromagnetic interference shielding component 521 substantially. The configuration of the electromagnetic interference shielding component 521 is not limited to this embodiment, and any structure capable of cooperating with a casing of the input socket 40 is within the scope of the present invention. An inclined surface 5214 and the welding pin 5213 are formed on the side of each bending portion 5212 away from the plate body 5211, and the inclined surface 5214 is inclined from a lateral side of the bending portion 5212 and towards the welding pin 5213. The inclined surface 5214 can guide airflow and increase a safe distance between high and low pressures.

Furthermore, the electromagnetic interference shielding component 521 further includes at least one grounding pin disposed on at least one of the plate body 5211 and the bending portion 5212 and configured to ground with and screw to the housing 10. A folding portion 5215 is disposed on the plate body 5211 and extends in a direction parallel with and opposite to the bending portion 5212. A first grounding pin 5216 is disposed on the bending portion 5212, and a second grounding pin 5217 is disposed on the folding portion 5215 and extends in a direction opposite to the first grounding pin 5216. The first grounding pin 5216 and the second grounding pin 5217 are perpendicular to the bending portion 5212. The first grounding pin 5216 and the second grounding pin 5217 are grounded with and screwed to the housing 10. That is, the first grounding pin 5216 can be screwed to the upper casing 12, and the second grounding pin 5217 can be screwed to the lower casing 11, so that there is no need to utilize any additional fixture for fixing the electromagnetic interference shielding component 521, which facilitates an assembly process. Understandably, the configuration of the first grounding pin 5216 and the second grounding pin 5217 is not limited to this embodiment, and the first grounding pin 5216 and the second grounding pin 5217 also can be both disposed on the bending portion 5212 or the plate body 5211. Preferably, the electromagnetic interference shielding component 521 can be an integrally formed structure, but is not limited to it.

Please refer to FIG. 3 to FIG. 5. According to another embodiment, the electromagnetic shielding assembly 52 includes the electromagnetic interference shielding component 521, and two annular iron cores 522 respectively sheathing with and electrically connecting to the first grounding pin 5216 and the second grounding pin 5217 in a series connection and for filtering.

Please refer to FIG. 2 to FIG. 6. When the electromagnetic shielding assembly 52 is installed on the auxiliary circuit board 51, the welding pin 5213 of the electromagnetic interference shielding component 521 is electrically connected to the end of the auxiliary circuit board 51. The electromagnetic interference shielding component 521 can be used as a current discharging path when the circuit is abnormal and a leakage path of a lightning tube 532 when the lightning strikes. The current can be transmitted to the ground through the welding pin 5213, the first grounding pin 5216 and the second grounding pin 5217. The electromagnetic interference shielding component 521 is disposed adjacent to the input socket 40 and has a high conductivity better than a copper core wire, and the conductive sectional area of the electromagnetic interference shielding component 521 is larger than a sectional area of the copper core wire, thereby reducing the impedance on the ground loop, increasing the discharging speed and time, and reducing the amount of disturbance of the large current instantaneous to the ground. Additionally, the first grounding pin 5216 and the second grounding pin 5217 of the electromagnetic interference shielding component 521 can not only provide grounding function but also fix to the upper casing 12 and the lowercasing 11, so that there is no need to utilize any additional fixture for fixing the electromagnetic interference shielding component 521, which facilitates an assembly process and simplifies the structure. Furthermore, the electromagnetic interference shielding component 521 can cover the input socket 40 so as to provide EMI shielding function. In summary, the electromagnetic interference shielding component 521 of the present invention provides the functions of EMI shielding, lightning (current) discharge, and fixture.

Please refer to FIG. 3 to FIG. 4 and FIG. 7 to FIG. 8. The lightning protection circuit 53 includes at least one surge absorber 531 and at least one lightning tube 532 electrically connected to the auxiliary circuit board 51 and located on a lateral side of the surge absorber 531. The surge absorber 531 can be a cylinder structure, two pins of the surge absorber 531 are electrically connected to another end of the auxiliary circuit board 51, and a center of a bottom surface of the surge absorber 531 corresponds to an axis L of the fan 30. That is, the center of the bottom surface of the surge absorber 531 and the axis L of the fan 30 can be distributed in a collinear arrangement, as shown in FIG. 8. In this embodiment, two lightning tubes 532 are electrically connected to the auxiliary circuit board 51 and located on upper and lower sides of the surge absorber 531. Furthermore, the lightning protection circuit 53 can further include at least one insulating component 533 for covering the surge absorber 531 to provide insulating and protecting functions for the surge absorber 531.

Please refer to FIG. 1 to FIG. 4 and FIG. 7 to FIG. 8. When the electromagnetic interference and lightning protection module 50 is installed inside the housing 10, the auxiliary circuit board 51 is positioned in a gap between the second lateral plate 122 and the input socket 40 and perpendicular to the main circuit board 20. The electromagnetic interference shielding component 521 covers the input socket 40, the first grounding pin 5216 is screwed to the top plate 121, and the second grounding pin 5217 is screwed to the bottom plate 111. The surge absorber 531 is disposed adjacent to and spaced from the fan 30, so that the center of the bottom surface of the surge absorber 531 and the axis L of the fan 30 can be distributed in the collinear arrangement. Thus, according to the fluid mechanics, it can directly reduce an internal drag coefficient of the power supply 1, and a spiral effect of fan blades of the fan 30 can be utilized to guide wind flow to flow along a path with the low wind resistance around the surge absorber 531, so that the spiral wind can be directly discharged outside the power supply 1, so as to eliminate the thermal vortex effect and not to affect and reduce the wind flow (CFM).

In summary, the electromagnetic interference and lightning protection module 50 of the present invention includes the electromagnetic interference shielding component 521 with the functions of EMI shielding, lightning (current) discharging and fixture, the lightning protection circuit 53 and the electromagnetic interference filter circuit, and therefore the electromagnetic interference and lightning protection module 50 has EMI filtering, lightning protection and other functions, so that the structure is simplified, the EMI filtering parameters and parts can be changed, the lightning protection level can be adjusted, and the input socket 40 of different types can be matched (For example, C14 or C16). Furthermore, the surge absorber 531 and the axis of the fan 30 are disposed correspondingly, and therefore, according to the fluid mechanics, it can directly reduce the internal drag coefficient of the power supply 1, and the spiral effect of fan blades of the fan 30 can be utilized to guide the wind flow to flow along the path with the low wind resistance around the surge absorber 531, so that the spiral wind can be directly discharged outside the power supply 1, so as to eliminate the thermal vortex effect and not to affect and reduce the wind flow (CFM). Besides, the electromagnetic interference filter circuit, the electromagnetic shielding component 52 and the lightning protection circuit 53 are all disposed on the auxiliary circuit board 51, which can effectively save a wiring area of the main circuit board 20, and the utilization of the electromagnetic shielding component 52 can reduce the composite material (e.g. wire) to be used, so as to reduce the manufacture cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electromagnetic shielding assembly adapted for a power supply, the electromagnetic shielding assembly comprising:
   an electromagnetic interference shielding component comprising:
      a plate body;
      a bending portion, an included angle being formed between the plate body and the bending portion, and the plate body and the bending portion cooperatively covering an input socket of the power supply;
      a first grounding pin is disposed on the bending portion, a second grounding pin is disposed on the plate body and extends in a direction opposite to the first grounding pin, and the first grounding pin and the second grounding pin are grounded with and screwed to the housing of the power supply; and
      a welding pin disposed on a side of the bending portion away from the plate body and configured to electrically connect to an auxiliary circuit board.

2. The electromagnetic shielding assembly of claim 1, wherein a folding portion is disposed on the plate body and extends in a direction parallel with and opposite to the bending portion, and the second grounding pin is disposed on the folding portion.

3. The electromagnetic shielding assembly of claim 1, wherein an inclined surface is formed on the side of the bending portion away from the plate body and inclined from a lateral side of the bending portion and towards the welding pin.

4. The electromagnetic shielding assembly of claim 1, wherein the electromagnetic interference shielding component is substantially formed in a U shape.

5. The electromagnetic shielding assembly of claim 1, wherein the electromagnetic interference shielding component is an integrally formed structure.

6. The electromagnetic shielding assembly of claim 1, further comprising an annular iron core electrically connected to the at least one grounding pin in a series connection and for filtering.

7. An electromagnetic interference and lightning protection module adapted for a power supply, the electromagnetic interference and lightning protection module comprising:
   an electromagnetic interference shielding component comprising:
      a plate body;
      a bending portion, an included angle being formed between the plate body and the bending portion, and the plate body and the bending portion cooperatively covering an input socket of the power supply;

at least one grounding pin disposed on at least one of the plate body and the bending portion and configured to ground with and screw to a housing of the power supply; and a welding pin disposed on a side of the bending portion away from the plate body and configured to electrically connect to an end of an auxiliary circuit board; and a lightning protection circuit comprising at least one surge absorber electrically connected to another end of the auxiliary circuit board and located in a position corresponding to an axis of a fan of the power supply, and the electromagnetic interference shielding component and the at least one surge absorber being disposed at a same side of the auxiliary circuit board.

8. The electromagnetic interference and lightning protection module of claim 7, wherein a first grounding pin is disposed on the bending portion, a second grounding pin is disposed on the plate body and extends in a direction opposite to the first grounding pin, and the first grounding pin and the second grounding pin are grounded with and screwed to the housing of the power supply.

9. The electromagnetic interference and lightning protection module of claim 7, wherein the lightning protection circuit further comprises at least one lightning tube electrically connected to the auxiliary circuit board and located on a lateral side of the surge absorber.

10. The electromagnetic interference and lightning protection module of claim 9, wherein the at least one surge absorber is a cylinder structure, and a center of a bottom surface of the at least one surge absorber corresponds to the axis of the fan of the power supply.

11. The electromagnetic interference and lightning protection module of claim 7, wherein the lightning protection circuit further comprises at least one insulating component for covering the at least one surge absorber.

12. The electromagnetic interference and lightning protection module of claim 7, further comprising an electromagnetic interference filter circuit disposed on the auxiliary circuit board.

13. A power supply comprising:
a housing comprising an upper casing and a lower casing combined with each other;
a main circuit board disposed on the lower casing;
a fan disposed on the lower casing and adjacent to the main circuit board;
an input socket disposed on an end of the lower casing and spaced from the fan; and
an electromagnetic interference and lightning protection module comprising:
  an electromagnetic interference shielding component comprising:
    a plate body;
    a bending portion, an included angle being formed between the plate body and the bending portion, and the plate body and the bending portion cooperatively covering the input socket;
    at least one grounding pin disposed on at least one of the plate body and the bending portion and configured to ground with and screw to the housing; and
    a welding pin disposed on a side of the bending portion away from the plate body and configured to electrically connect to an end of an auxiliary circuit board; and
  a lightning protection circuit comprising at least one surge absorber electrically connected to another end of the auxiliary circuit board and located in a position corresponding to an axis of the fan, and the electromagnetic interference shielding component and the at least one surge absorber being disposed at a same side of the auxiliary circuit board;
wherein the auxiliary circuit board is disposed between the housing and the input socket and perpendicular to the main circuit board, and the at least one surge absorber is disposed between the input socket and the fan.

* * * * *